US006764926B2

(12) United States Patent
Takeuchi et al.

(10) Patent No.: US 6,764,926 B2
(45) Date of Patent: Jul. 20, 2004

(54) METHOD FOR OBTAINING HIGH QUALITY INGAASN SEMICONDUCTOR DEVICES

(75) Inventors: Tetsuya Takeuchi, Sunnyvale, CA (US); Ying-Lan Chang, Cupertino, CA (US); David P. Bour, Cupertino, CA (US); Michael H. Leary, Fremont, CA (US); Michael R. T. Tan, Menlo Park, CA (US); Andy Luan, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 82 days.

(21) Appl. No.: 10/106,472

(22) Filed: Mar. 25, 2002

(65) Prior Publication Data

US 2003/0181024 A1 Sep. 25, 2003

(51) Int. Cl.[7] ............................................. H01L 21/00
(52) U.S. Cl. ........................ 438/477; 438/507; 438/681
(58) Field of Search ........................... 438/477, 45, 46, 438/47, 507, 509, 681; 372/45, 46

(56) References Cited

U.S. PATENT DOCUMENTS

| 5,903,586 A | 5/1999 | Ramdani et al. |
| 5,944,913 A | 8/1999 | Hou et al. |
| 5,978,398 A | 11/1999 | Ramdani et al. |
| 6,046,096 A | * 4/2000 | Ouchi et al. ................. 438/510 |
| 2002/0121674 A1 | * 9/2002 | Weiser et al. ................ 257/530 |

FOREIGN PATENT DOCUMENTS

| WO | WO01/52373 | 12/2000 |

OTHER PUBLICATIONS

Kawaguchi et al., "Lasing Characteristics of Low-Treshold GaInNAs Laser Grown by MOCVD", Japan Journal of Applied Physics, vol. 40 (2001), pp. 744–746.*
Miyamoto, T., et al., "CBE and MOCVD Growth of GaInNAs" Journal of Crystal Growth 209, 2000, pp. 339–344.
King, R. R., "Next–Generation, High–Efficiency III–V Multijunction Solar Cells", 28th IEEE Photovoltaic Specialists Conference, 2000, pp. 998–101.
Heroux, J.B. "GaInNAs Resonant–Cavity–Enhanced Photodetector Operating at 1.3μm", Applied Physics Letters, vol. 75, No. 18, pp. 2716–2718.
Kawaguchi et al., "Lasing Characteristics of Low–Threshold GaInNAs Laser Grown by Metalorganic Chemical Vapor Deposition", Japan Journal of Applied Physics, vol. 40(2001) pp. 744–746.
Kageyama et al., "High–Temperature Operation up to 170 Degrees C of GaInNAs–GaAs Quantum–Well Lasers Grown by Chemical Beam Epitaxy", IEEE Photonics Technology Letters, vol. 12, No. 1, Jan. 2000, pp. 10–12.
Sato et al. "Continuous Wave Operation of 1.26μm GaInNAs/GaAs Vertical–Cavity Surface–Emitting Lasers Grown by Metalorganic Chemical Vapour Deposition", Electronic Letters, Nov. 23, 2000, vol. 36, No. 24, pp. 2018–2019.
Harris, J.S. Jr., "GaInNAs, a New Material for Long Wavelength VCSELs", 10th Seoul Interlational Symposium on Physics of Semicondcutors and Application, Nov. 1–3, 2000, p. 1.

* cited by examiner

Primary Examiner—Alexander Ghyka
(74) Attorney, Agent, or Firm—Juergen Krause-Polstorff

(57) ABSTRACT

A method for making high quality InGaAsN semiconductor devices is presented. The method allows the making of high quality InGaAsN semiconductor devices using a single MOCVD reactor while avoiding aluminum contamination.

20 Claims, 7 Drawing Sheets

METHOD FOR OBTAINING HIGH QUALITY INGAASN SEMICONDUCTOR DEVICES

CROSS REFERENCE TO RELATED APPLICATIONS

This application relates to the co-pending application Ser. No. 10/106,678, filed on the same day, entitled "Asymmetric InGaAsN Vertical Cavity Surface Emitting Lasers" by Takeuchi, Chang, Bour, Leary and Tan, owned by the assignee of this application and incorporated herein by reference.

BACKGROUND

The invention relates to a method for making high quality InGaAsN semiconductor devices using metal organic chemical vapor deposition.

InGaAsN is an attractive material for a variety of semiconductor applications. InGaAsN is useful in the area of long wavelength edge-emitting lasers and vertical cavity surface emitting lasers (VCSEL) in the optical communications area because the material is readily grown on GaAs wafers which provides higher conduction band offset and allows the use of GaAs/AlAs high reflective distributed Bragg reflectors (DBRs).

A number of research groups have achieved room temperature continuous wave (CW) operation of InGaAsN VCSELs that were made using molecular beam epitaxy (MBE). Room temperature continuous wave operation of InGaAsN VCSELs has been achieved in VCSELs made using metal organic chemical vapor deposition (MOCVD) using dimethylhydrazine (DMHy) as a source of nitrogen. MOCVD is preferred over MBE as the growth technique for achieving mass production. To achieve commercial use of InGaAsN VCSELs, further improvements in device performance such as lowering the threshold current density and extending the device lifetime are necessary.

It has been reported by Sato et al. in Electronics Letters, 33, 1997, 1386, that the surface morphology of the InGaAsN active region grown directly on the AlGaAs cladding layer using MOCVD appears powder-like, indicating three dimensional growth. Kawaguchi et al. report in Electronics Letters 36, 2000, 1776, that continuous MOCVD growth of InGaAsN layers on GaAs/AlGaAs layers results in poor optical quality of the InGaAsN layer while switching to a two reactor process yields a substantially better optical quality InGaAsN layer. Sato et al., IEEE Photonics Technology Letters, 12, 1999, 1386 achieved good results for a highly strained GaInAsN ridge stripe laser using MOCVD by using aluminum free cladding layers. This approach is not useful for VCSELs because the highly reflective AlGaAs/GaAs DBR mirror can not be used.

SUMMARY OF THE INVENTION

Investigation by secondary ion mass spectroscopy (SIMS) indicates that conventional metal organic chemical vapor deposition (MOCVD) growth of InGaAsN active layers on GaAs/AlGaAs layers results in appreciable aluminum contamination (close to one percent) and is responsible for performance loss in a variety of semiconductor devices. Poor optical properties of InGaAsN active regions for InGaAsN edge emitters and InGaAsN VCSELs as well as lower than expected current gain in bipolar transistors are attributable to Al contamination of the active regions. In InGaAsN solar cell and InGaAsN photodetector structures (see for example, R. R. King et al, Conference Record of the 28th IEEE Photovoltaic Specialists Conference, 2000, 998 and J. B. Heroux et al, Applied Physics Letters, 75, 1999, 2716), elimination of Al contamination results in high quality InGaAsN absorbing layers that result in higher quantum efficiencies for those semiconductor devices. Additionally, InGaAsN active regions grown over AlGaAs layers show more O and C incorporation than InGaAsN active regions grown without underlying AlGaAs layers. To avoid aluminum incorporation into InGaAsN layers, embodiments in accordance with the invention are disclosed.

In accordance with the invention, either layers are grown in the semiconductor structure whose growth serves to getter Al atoms/Al containing molecules or chemicals may be introduced into the MOCVD chamber via flow gases that serve to getter Al atoms/Al containing molecules. The methods reduce the Al content that is incorporated into the N containing layers and result in improvements in the quality of the InGaAsN layer including smoother surface structure, improved optical qualities and lower levels of recombination centers due to, for example, O and C incorporation that typically accompanies the Al incorporation.

DETAILED DESCRIPTION OF THE INVENTION

Figure 1A:
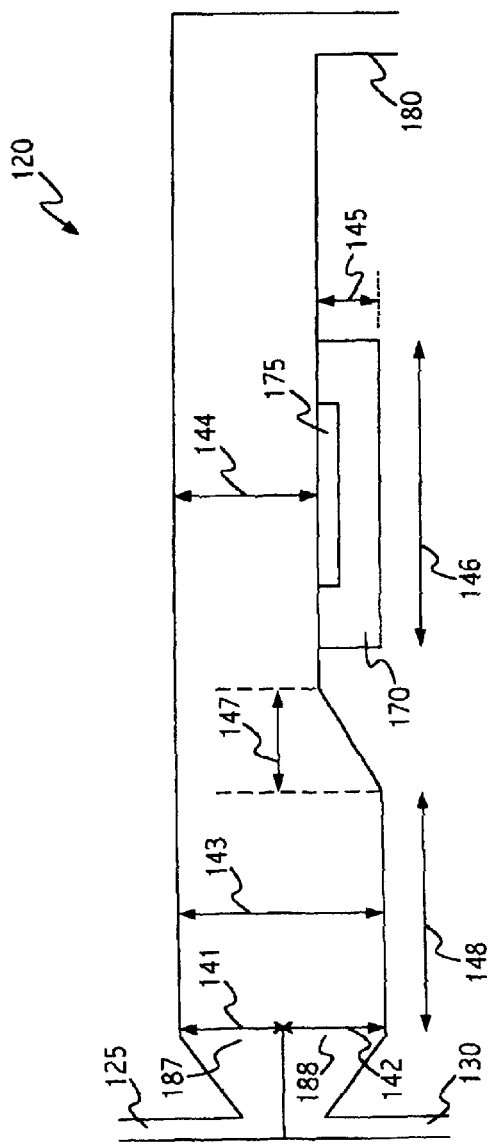
FIG. 1a shows a side view of a typical MOCVD reactor in accordance with the invention.

In accordance with the invention, methods are disclosed to control incorporation of Al from the growth of Al containing layers such as AlGaAs layers into active InGaAsN layers that are grown continuously on GaAs/AlGaAs. These methods typically involve either the growth of layers in the semiconductor device that serves to getter Al atoms/Al containing molecules or the introduction of chemicals into the MOCVD chamber with flow gases that serve to getter Al atoms/Al containing molecules without accompanying layer growth.

In accordance with the invention, layers whose growth also functions to getter Al atoms or molecules containing Al can be grown at any time before the growth of the InGaAsN layer or between growth of the InGaAsN active layer and the previously grown AlGaAs layer to reduce Al contamination of the InGaAsN active layer. Typically, layers whose growth involves atoms/molecules which react more effectively with Al or Al containing molecules than As atoms or molecules containing As are suitable. In particular, growth of layers that contain N and/or P atoms is typically effective in reducing the Al contamination when the total amount of N and/or P atoms introduced into the MOCVD reactor is greater than the amount of Al atoms that are introduced into the MOCVD reactor prior to the growth of the InGaAsN active layer. Hence, the absolute amounts will be MOCVD reactor specific. The flow rate of the Al gettering chemical and time of application is determined by setting the total amount of gettering atoms such as N and/or P introduced by the flow to be greater than the total amount of Al introduced into the reactor chamber. It should be noted that in accordance with the invention it is effective to use this method even if Al layers in the device structure are only grown after the InGaAsN active layer is grown since in commercial applications, reactors are used repeatedly to grow the same device structure leading to Al contamination from the previous run.

In accordance with the invention, chemicals that getter Al atoms/Al containing molecules may be introduced via flow gases into the MOCVD reactor anytime before growth of the InGaAsN layer or anytime before growth of the InGaAsN layer and after growth of the AlGaAs layer to reduce Al contamination of the InGaAsN layer. Typically, chemicals that can react more effectively with Al atoms/Al containing molecules than As atoms or molecules containing As are introduced via flow gases into the MOCVD reactor anytime before growing the InGaAsN layer or anytime before growth of the InGaAsN layer and after the growth of the AlGaAs layer. In particular, introduction of chemicals that contain N and/or P atoms via flow gases into the MOCVD is typically effective when the total amount of N and/or P atoms in the chemicals is greater than the total number of Al atoms that are introduced before the InGasAsN layer is grown.

In accordance with the invention, any semiconductor devices using InGaAsN layers and Al containing layers such as AlGaAs, AlGaInP and AlGaInAsP may be made using a single reactor MOCVD process while obtaining high quality InGaAsN layers having low levels of Al contamination. For example, solar cell and photodetector device structure using high quality InGaAsN absorbing layers results in higher quantum efficiencies while bipolar transistors using InGaAsN collector and base layers suffer less from the presence of recombination centers which lead to low current gain.

Figure 1B:
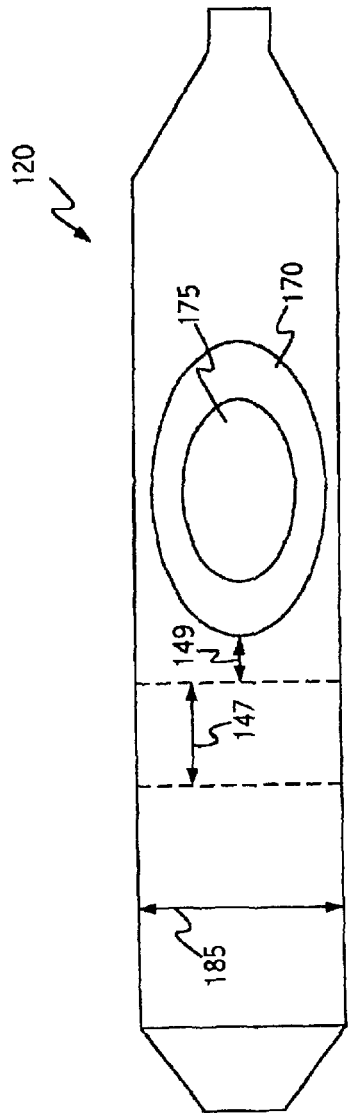
FIG. 1b shows a top view of a typical MOCVD reactor in accordance with the invention.

In accordance with the invention, FIG. 1a shows MOCVD reactor 120 in side view with exhaust line 180. MOCVD reactor 120 is a cold wall, quartz reactor. Group-III source injection occurs at inlet 125 and Group-V source injection occurs at inlet 130. Group III and Group V gases begin mixing after passing from outlets 187 and 188. Outlets 187 and 188 are both approximately 13 cm×2 cm rectangles. Vertical height 143 of MOCVD reactor 120 is approximately 4.5 cm while dimension 144 is approximately 3 cm. Dimension 148 is approximately 7 cm and is the distance from where the Group III and Group V gases begin to mix to where the vertical constriction of MOCVD reactor 120 starts. Dimension 147 is approximately 7 cm and SiC-coated graphite susceptor 170 has diameter 146 of approximately 11 cm with thickness 145 of approximately 1.5 cm. Substrate 175 is positioned on susceptor 170 as shown in FIGS. 1a and 1b. With reference to FIG. 1b, lateral dimension 185 of MOCVD reactor 120 is approximately 13 cm while dimension 149 is approximately 1.5 cm.

Figure 2:
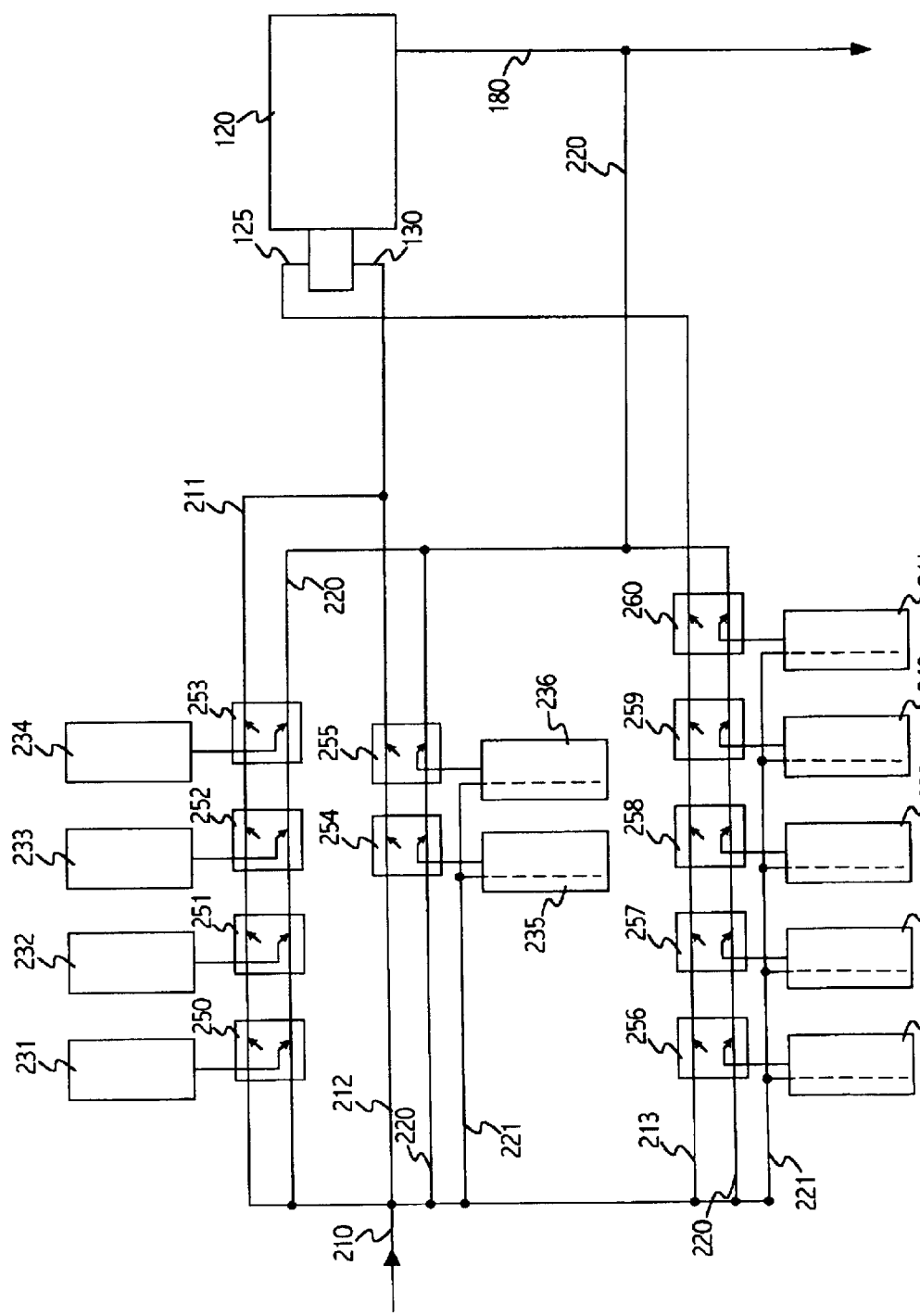
FIG. 2 shows arrangement of the chemical delivery system for the typical MOCVD reactor in FIG. 1a and FIG. 1b

In accordance with the invention, FIG. 2 shows an arrangement of the chemicals and lines feeding into MOCVD reactor 120. MOCVD reactor 120 is typically a cold wall, quartz reactor. Valves 250, 251, 252 and 253 control and direct flow from tanks 231, 232, 233, and 234, respectively. Valves 254, 255, 256, 257, 258, 259 and 260 control and direct flow from bubblers 235, 236, 237, 238, 239, 240 and 241, respectively. Inlet 210 serves to introduce $H_2$ carrier gas into MOCVD reactor 120 via line 212 to inlet 130 of MOCVD reactor 120. Line 212 serves as well for typically introducing Tertiarybutylarsine (TBAs) from bubbler 235 and Dimethylhydrazine (DMHy) from bubbler 236 into MOCVD reactor 120 via inlet 130. Valves 254 and 255 direct flow from bubblers 235 and 236, respectively, into either line 212 or vent line 220. Vent lines 220 connect to exhaust line 180. Line 221 serves to introduce $H_2$ into bubblers 235 and 236 while line 222 serves to introduce $H_2$ into bubblers 237, 238, 239, 240 and 241. Line 211 serves to introduce $NH_3$ from tank 231, $AsH_3$ from tank 232, $PH_3$ from tank 233 and $Si_2H_6$ from tank 234 into MOVCD reactor 120 via inlet 130.

Valves 250, 251, 252 and 253 direct flow from tanks 231, 232, 233 and 234, respectively, into either line 211 or vent line 220. Line 213 serves to typically introduce Trimethylgalium (TMGa) from bubbler 237, Triethylgallium (TEGa) from bubbler 238, Trimethyaluminum (TMAl) from bubbler 239, Trimethylindium (TMIn) from bubbler 240 and $CBr_4$ from bubbler 241 into MOCVD reactor 120 via inlet 125. Valves 256, 257, 258, 259 and 260 direct flow from bubblers 237, 238, 239, 240 and 241, respectively, into either line 213 or vent line 220. Note that there is no back flow in any of the lines since a mechanical pump (not shown) maintains the pressure inside reactor 120 at about 100 mbar.

Figure 3:
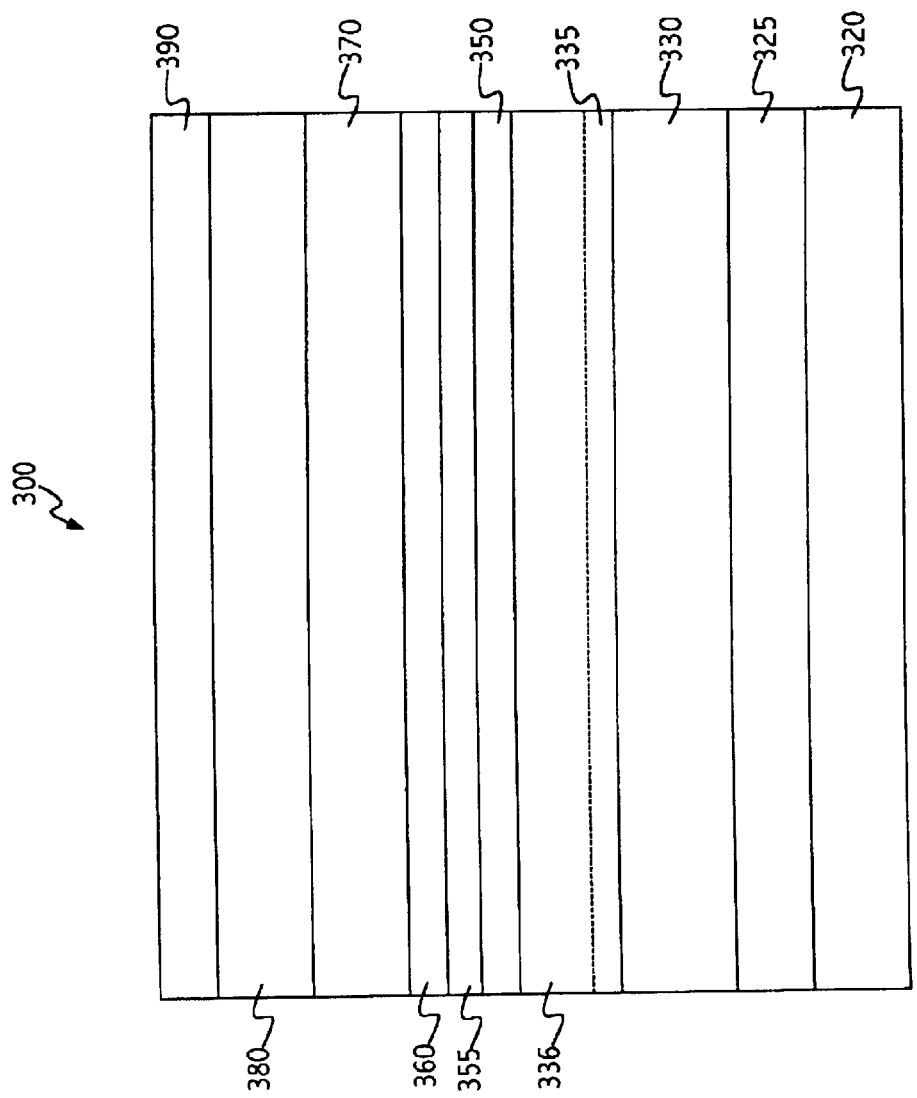
FIG. 3 shows a test structure in accordance with the invention.

FIG. 3 shows InGaAsN quantum well photoluminescence (PL) test structure 300 in an embodiment according to the invention. To grow test structure 300, GaAs buffer layer 325, typically having a thickness in the range of about 1000–5000 Å, is grown on GaAs substrate 320 at a temperature in the range of about 600–800° C. using Trimethylgallium (TMGa) and arsine ($AsH_3$) at a pressure in the range of about 50–400 mbar $H_2$ ambient. Then $Al_{0.3}Ga_{0.7}As$ layer 330, typically having a thickness of 0.9 $\mu$m, is grown on GaAs buffer layer 325 by introducing Trimethylaluminum (TMAl). The introduction of TMAl is then stopped and GaAs layer 335 is grown to a thickness in the range of about 50–300 Å. The total amount of TMAl supplied is about $4 \times 10^{-4}$ mol. Following growth of GaAs layer 335, the growth process is interrupted by shutting off the supply of TMGa. A flow of $AsH_3$ typically at about 300 sccm is continuously introduced into an MOCVD reactor such as MOCVD reactor 120 to prevent degradation of the exposed surface of GaAs layer 335. Surface degradation is typically a problem if the temperature exceeds approximately 400° C. and should be avoided.

Then, typically, $NH_3$ (ammonia) is introduced at a typical flow rate of about 500 sccm at a temperature and pressure in the range of about 400–700° C. and 50–1000 mbar, typically at 500–600° C. and 100 mbar, respectively. $NH_3$ is attractive for reasons of cost and purity. The application time for the $NH_3$ can be varied, typically from between about 0.5 minutes to about 4 minutes. Longer application times reduce the amount of ambient Al available for incorporation into InGaAsN layer 350 and InGaAsN layer 360. An application time of 0.5 minutes at a flow rate of about 500 sccm introduces about $1 \times 10^{-2}$ mol of N atoms while an application time of about 4 minutes at a flow rate of about 500 sccm introduces about $8 \times 10^{-2}$ mol of N atoms into MOCVD reactor 120. The amount of N atoms introduced changes linearly with the time of application. The selected time and flow rate of the $NH_3$ assure that the total number of N atoms is greater than the total number of Al atoms introduced into MOCVD reactor 120 prior to InGaAsN growth. In accordance with an embodiment of the invention, $NH_3$ strongly reacts with TMAl, the Al source used in the growth of the Al containing layers, even at room temperature. $NH_3$ also has a very high pyrolysis temperature in comparison to the growth temperature of GaAs based material so that undesired incorporation of N into the surface of GaAs layers is minimized during the $NH_3$ flow. $NH_3$ is also attractive for reasons of cost and purity. $NH_3$ may be replaced by a number of other chemicals which contain nitrogen atoms or phosphorus atoms and react strongly with Al sources to fulfill the Al gettering function, such as, for example, Monomethylamine, Dimethylamine, hydrazine, Monomethylhydrazine, Dimethylhydrazine, Tertiarybutylhydrazine, Phenylhydrazine, phosphine or Tertiarybutylphosphine. In general, chemicals that react strongly with Al sources to fulfill the Al gettering function may be used as long as the chemicals do not have a strong adverse effect on the semiconductor layers.

Following the $NH_3$ flow, growth is resumed with GaAs layer 336. GaAs wave guide layer 336 is grown to a thickness in the range of about 1000–2000 Å as the temperature is decreased to about 500–600° C. Following completion of the growth for GaAs layer 336, InGaAsN active layer 350 is grown to a thickness in the range of about 60–100 Å at a temperature in the range of about 500–600° C. using Triethylgallium (TEGa), Trimethylindium (TMIn), Tertiarybutylarsine (TBAs) and Dimethylhydrazine (DMHy). The ratio of DMHy/(DMHy+TBAs) in the range of 0.95–0.99 is used for growth of InGaAsN active layers 350 and 360. GaAs barrier layer 355 is inserted between InGaAsN active layer 350 and InGaAsN active layer 360, having a thickness in the range of about 100–300 Å. Then InGaAsN active layer 360 is grown to a thickness in the range of about 60–100 Å at a temperature in the range of about 500–600° C. using Triethylgallium (TEGa), Trimethylindium (TMIn), Tertiarybutylarsine (TBAs) and Dimethylhydrazine (DMHy). After growth of InGaAsN active layer 360, GaAs wave guide layer 370 is grown to a thickness in the range of about 1000–2000 Å while the temperature is increased to about 600–800° C. and using Trimethylgallium (TMGa) and arsine ($AsH_3$) at a pressure in the range of about 50–1000 mbar $H_2$ ambient. Then $Al_{0.3}Ga_{0.7}As$ layer 380 is grown, by introducing TMAl, to a thickness in the range of about 1000–2000 Å and growth is completed with GaAs cap layer 390 grown to a thickness which is in the range of about 50–300 Å.

Figure 4:
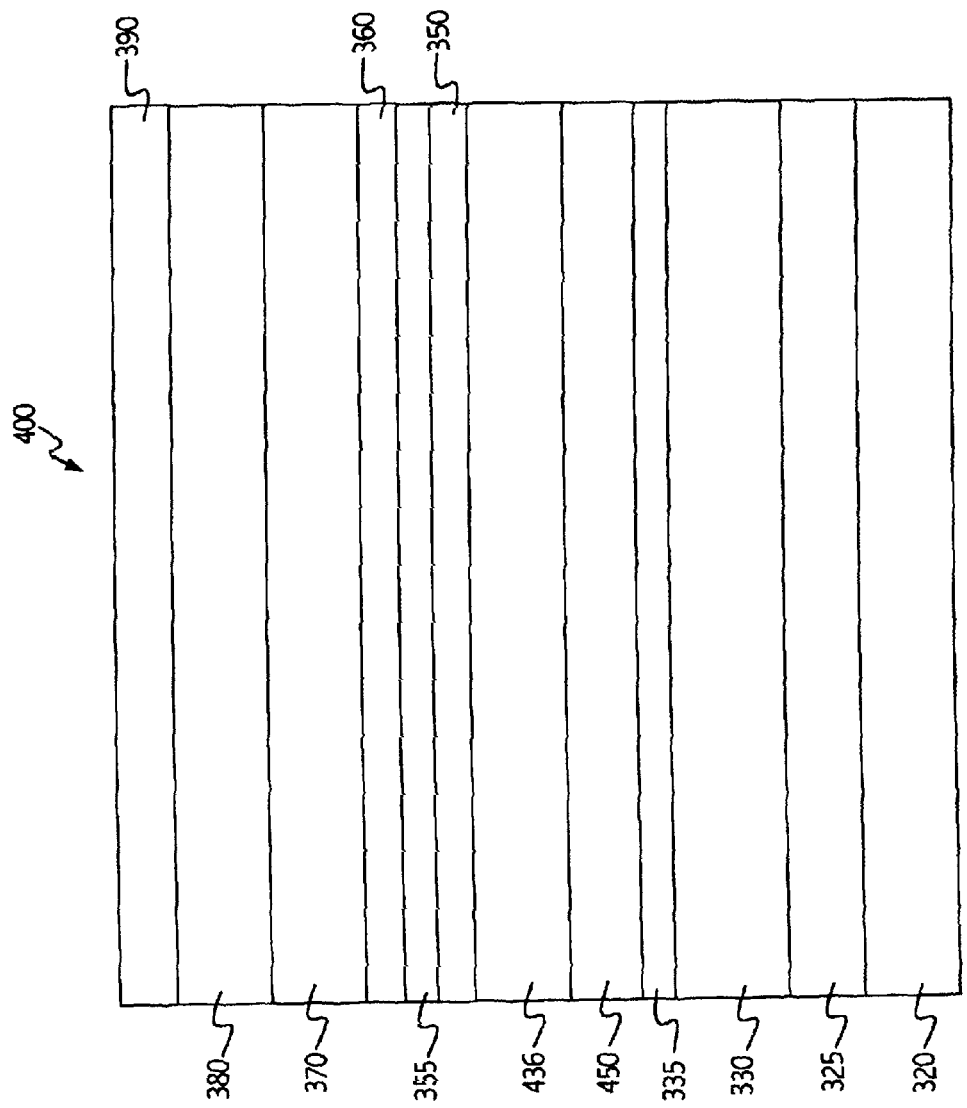
FIG. 4 shows a test structure in accordance with the invention.

Another embodiment in accordance with the invention is shown in FIG. 4. Test structure 400 is similar to test structure 300 but test structure 400 adds GaAsN non-active layer 450 having a typical thickness of about 600 Å after growth of GaAs layer 335. GaAsP may be substituted for GaAsN in non-active layer 450. GaAs layer 335 is deposited as described above. Then GaAsN non-active layer 450 is grown by introducing TMGa and $AsH_3$ at a flow rate of typically about 300 sccm continuously and $NH_3$ at a flow rate of typically about 500 sccm for approximately 4 minutes while decreasing the growth temperature to a range of 500–600° C. Next GaAs layer 436 is grown to a thickness in the range of about 400–1000 Å before growing InGaAsN active layer 350 as described above. The selected time and flow rate of the $NH_3$ assure that the total number of N atoms is greater than the total number of Al atoms introduced into reactor 120 prior to InGaAsN growth. All subsequent steps are as previously described for test structure 300.

In the event that InGaP is substituted for GaAsN in non-active layer, TMGa, Trimethylindium (TMIn) and $PH_3$ at a flow rate of 500 sccm are supplied in place of TMGa and $AsH_3$. Typical thickness is still about 600 Å. The temperature is typically kept at about 700° C. for the InGaP growth. After completion of the InGaP growth, TMGa and $AsH_3$ are supplied for growing GaAs layer 436 having a thickness in the range of about 400–1000 Å while the temperature is typically decreased to a range of about 500–600° C. for growth of InGaAsN active layer 350. All subsequent steps are as previously described for test structure 300.

Figure 5:
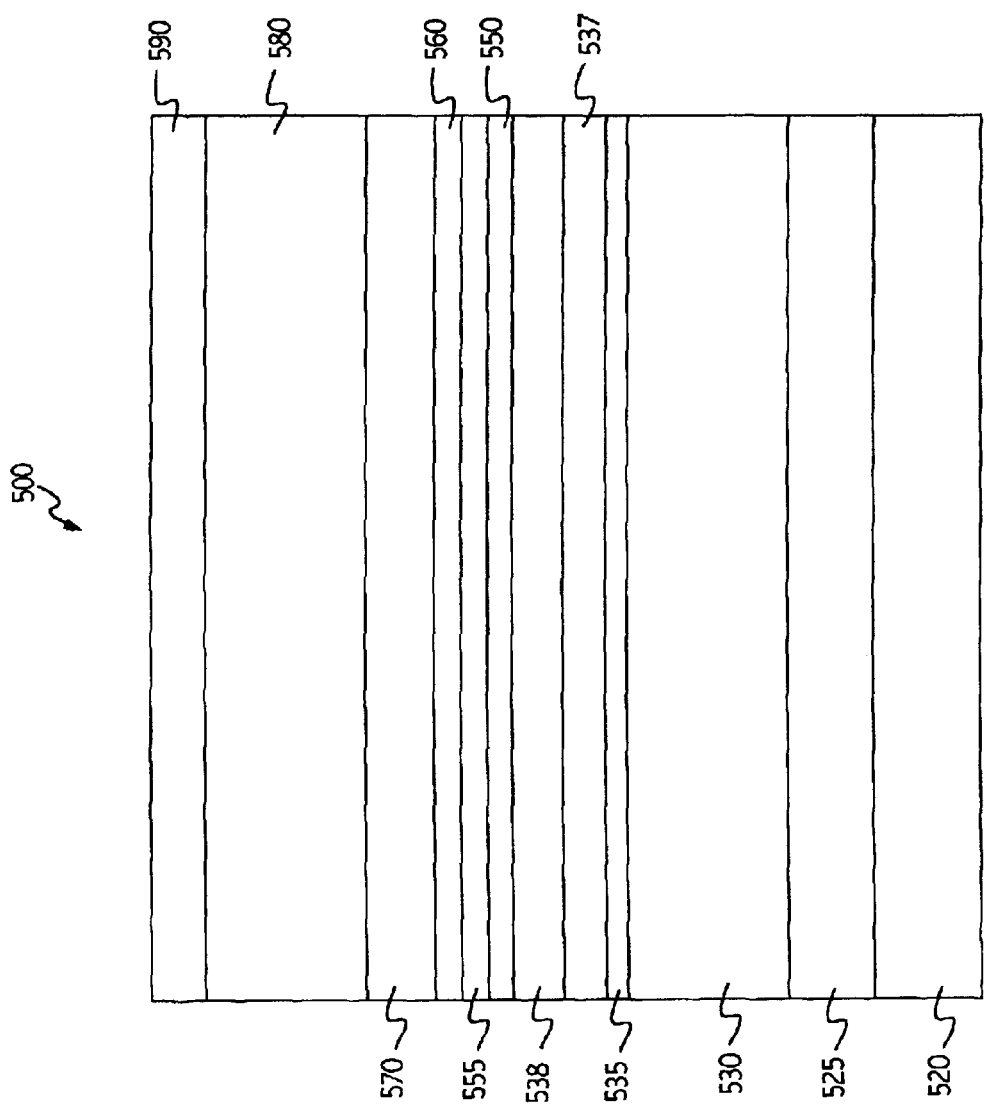
FIG. 5 shows an edge emitting laser structure in accordance with the invention.

FIG. 5 shows edge emitting laser structure 500 in an embodiment in accordance with the invention. Si-doped GaAs layer 525 with a typical Si doping level in the range of $1.0 \times 10^{17} - 5 \times 10^{18}$ $cm^{-3}$, is grown on GaAs substrate 520, to a thickness in the range of about 1000–5000 Å at a temperature of about 600–800° C. using TMGa, $AsH_3$ and $Si_2H_6$ under 100 mbar $H_2$ ambient. Subsequently, Si-doped $Al_xGa_{1-x}As$ cladding layer 530 where x is in the range of about 0.2 to 0.8, with a Si doping level in the range of $1.0 \times 10^{17} - 5 \times 10^{18}$ $cm^{-3}$, is grown on Si-doped GaAs layer 525 by additionally supplying TMAl to grow Si-doped $Al_xGa_{1-x}As$ cladding layer 530 to a thickness of about 1.5 $\mu$m. The total amount of TMAl supplied is in the range from about $5 \times 10^{-4}$ mol to $2 \times 10^{-3}$ mol. Stopping the TMAl and $Si_2H_6$ supply, undoped GaAs non-active layer 535 is grown over Si-doped $Al_xGa_{1-x}As$ cladding layer 530 to a thickness in the range of about 50–300 Å. Then $GaAs_{1-x}N_x$ non-active layer 537 where x is in the range of about 0 to 0.1, is grown to a typical thickness of about 600 Å by supplying TMGa, 300 sccm $AsH_3$ and 500 sccm of $NH_3$ for typically about 4 minutes while growth temperature is decreased to about 500–600° C. The total amount of $NH_3$ introduced is typically about $8 \times 10^{-2}$ mol which is more than ten times larger than the amount of TMAl that is typically supplied for the growth of bottom AlGaAs layer 530 in edge emitting laser structure 500 when using MOCVD reactor 120. $GaAs_{1-x}N_x$ in non-active layer 537 may be replaced by GaAsP, GaAsNP, InGaP, InGaAsP, InGaAsPN, InGaAsN or similar compounds in accordance with the invention. Also, instead of growth of $GaAs_{1-x}N_x$ non-active layer 537, $NH_3$ flow together with the growth interruption may be used to getter Al. $NH_3$ flow together with the growth interruption typically results in undoped GaAs layer 538 being grown to a typical thickness in the range of 1000–2000 Å to adjust for missing $GaAs_{1-x}N_x$ non-active layer 537. Hence, the thickness of undoped GaAs layer 538 in the $NH_3$ flow together with the growth interruption case is approximately equal to the combined thickness of $GaAs_{1-x}N_x$ non-active layer 537 and undoped GaAs layer 538 without growth interruption case.

Undoped GaAs layer 538 is grown to a thickness in the range of about 400–1000 Å over GaAsN layer 537 followed by growth of InGaAsN active layer 550 to a thickness in the range of about 60–100 Å at a temperature of about 500–600° C. with TEGa, TMIn, TBAs and DMHy. The ratio of DMHy/(DMHy+TBAs) is typically adjusted to be in the range of about 0.95–0.99 for InGaAsN growth. GaAs barrier layer 555 is grown over InGaAsN active layer 550 to a thickness in the range of about 100–300 Å. Subsequently, InGaAsN active layer 560 is grown over GaAs layer 555 to a thickness in the range of about 60–100 Å. At a temperature of about 500–600° C. with TEGa, TMIn, TBAs and DMHy. The ratio of DMHy/(DMHy+TBAs) is typically adjusted to be in the range of about 0.95–0.99 for InGaAsN growth. After growth of InGaAsN active layer 560, undoped GaAs wave guide layer 570 is grown to a thickness in the range of about 1000–2000 Å while the temperature is increased to about 600–800° C. C-doped $Al_xGa_{1-x}As$ cladding layer 580 with x typically in the range 0.2–0.8 and a typical C-doping level typically in the range of $1.0 \times 10^{17} - 5 \times 10^{18}$ $cm^{-3}$ is grown on undoped GaAs layer 570 to a thickness in the range of about 1.5–2.5 $\mu$m by additionally supplying TMAl and $CBr_4$ into MOCVD reactor 120. Finally, heavily C-doped GaAs contact layer 590 with a doping level in the range of $5.0 \times 10^{18} – 1.0 \times 10^{20}$ is grown over C-doped $Al_{0.3}Ga_{0.7}As$ layer 580 to a thickness in the range of about 500–2000 Å.

Broad-area laser diodes are fabricated from edge emitting laser structure 500 by cleaving facets perpendicular to the direction of light emission. If desired, a dielectric coating may be applied to the cleaved facets. The laser diode size is a laser stripe having a width of about 50 μm with a cavity length of about 500 μm. The threshold current density obtained for the resulting laser diode is typically about 1.23 kA/cm$^2$ at wavelength of about 1.323 μm. High-quality InGaAsN edge-emitting lasers may be obtained in embodiments in accordance with the invention.

Figure 6:
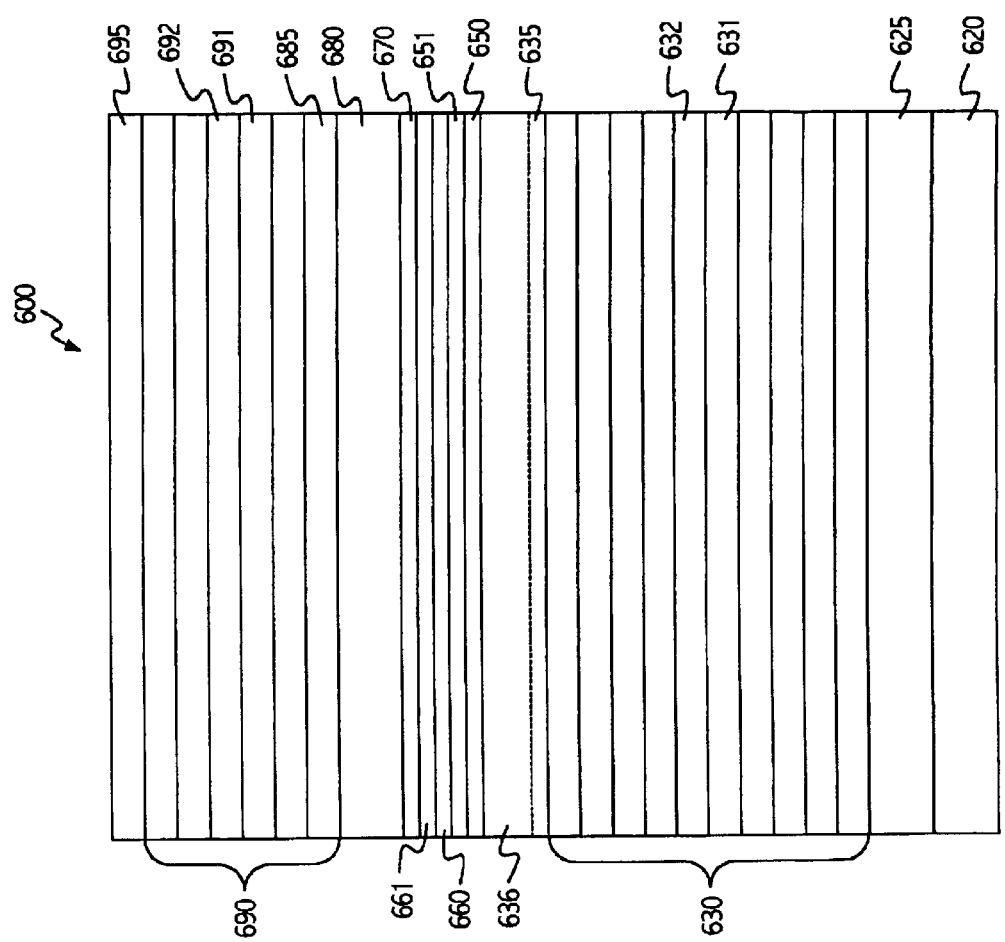
FIG. 6 shows a vertical cavity surface emitting laser structure in accordance with the invention.

FIG. 6 shows vertical cavity surface emitting laser structure 600 in an embodiment in accordance with the invention. Si-doped GaAs buffer layer 625 with a doping level typically in the range of $1.0 \times 10^{17} – 5.0 \times 10^{18}$ cm$^3$ is grown on GaAs substrate 620 to a thickness in the range of 1000–5000 Å at a temperature of about 600–800° C. Following growth of Si-doped GaAs buffer layer 625, bottom n-type DBR mirror structure 630 is grown. N-type DBR mirror structure 630 is typically made up of about 35–45 pairs of alternating layers of which Si-doped $Al_xGa_{1-x}As$ layer 631 and Si-doped GaAs layer 632 are typical with Si-doping typically in the range of $5.0 \times 10^{17} – 5.0 \times 10^{18}$ cm$^{-3}$. Si-doped $Al_xGa_{1-x}As$ layer 631 where x is between about 0.8 and 1.0 is grown to a typical thickness corresponding to one quarter of the emission wavelength. Si-doped GaAs layer 632 is grown to a typical thickness corresponding to one quarter of the emission wavelength with about 100–300 Å of grading at each interface. The grading profile is typically linear with distance from the interface. The grading serves to lower hetero barrier between AlGaAs and GaAs layers resulting in lower operating voltages for the VCSEL device. The total amount of TMAl supplied to MOCVD reactor 120 for growth of the AlGaAs layers is typically about $7 \times 10^{-3}$ mol. After completion of the growth for n-type DBR mirror structure 630, GaAs layer 635 is grown to a typical thickness in the range of about 50–300 Å. Following growth of GaAs layer 635, growth is interrupted by stopping the supply of TMGa while typically about 300 sccm of AsH$_3$ is continuously supplied to MOCVD reactor 120 to prevent surface degradation.

Then NH$_3$ is introduced at a flow rate of typically about 500 sccm at a typical temperature and pressure of about 600° C. and 100 mbar, respectively, for approximately 4 minutes. The total amount of NH$_3$ introduced is typically about $8 \times 10^{-2}$ mol which is approximately ten times larger than the amount of TMAl that is typically supplied for the growth of the Al containing layers that make up DBR mirror structure 630 when using MOCVD reactor 120. Alternatively, in place of the NH$_3$ flow, growth of a GaAsN layer may be substituted to getter the Al as discussed previously above. GaAsN may also be replaced, for example, by GaAsP, GaAsNP, InGaP, InGaAsP, InGaAsPN or InGaAsN. After completion of the NH$_3$ flow, GaAs layer 636 is grown to a thickness of about 1600 Å while the temperature is typically decreased to about 500–600° C. Then InGaAsN quantum well active layer 650 is grown to a thickness in the range of about 60–100 Å using TEGa, TMIn, TBAs and DMHy. The ratio of DMHy/(DMHy+TBAs) in the range of about 0.95–0.99 is typically used for growth of InGaAsN quantum well active layer 650. GaAs barrier layer 651 is grown over InGaAsN quantum well active layer 650 to a thickness in the range of 50–300 Å. Then quantum well active layer 660 is grown to a thickness in the range of about 60–100 Å using TEGa, TMIn, TBAs and DMHy. The ratio of DMHy/(DMHy+TBAs) in the range of about 0.95 0.99 is typically used for growth of InGaAsN quantum well active layer 660. GaAs barrier layer 661 is grown over InGaAsN quantum well active layer 660 to a thickness in the range of 50–300 Å. Then InGaAsN quantum well active layer 670 is grown to a thickness in the range of about 60–100 Å using TEGa, TMIn, TBAs and DMHy. The ratio of DMHy/(DMHy+TBAs) in the range of about 0.95–0.99 is typically used for growth of InGaAsN quantum well active layer 670. The total number of quantum wells as well as the thickness of quantum well active layers 650, 660, 670 and barrier layers 651, 661 may be adjusted to obtain the best results. The distance from the first quantum well active layer, for example, quantum well active layer 650 to the last quantum well active layer, for example, quantum well active layer 670 is fixed to be no greater than 600 Å. The thickness of GaAs cladding layer 636 and GaAs layer 680 is typically adjusted appropriately in order to put the layers extending from the first quantum well layer to the last quantum well layer, for example, quantum well active layer 650 to quantum well active layer 670, at a maximum of the standing wave cavity.

After growth of InGaAsN active layer 670, GaAs layer 680 is grown to thickness of about 1600 Å while the temperature is typically increased to about 600–800° C. Then p-type DBR mirror structure 690 is grown. P-type DBR mirror structure 690 is made up of about 20–35 pairs of alternating layers of which C-doped $Al_xGa_{1-x}As$ layer 691 (with x typically between 0.8 and 1) and C-doped $Al_yGa_{1-y}As$ layer 692 (with y typically between 0 and 0.2) are typical layer pairs and with C-doping typically in the range of $5.0 \times 10^{17} – 5.0 \times 10^{18}$ cm$^{-3}$. C-doped $Al_xGa_{1-x}As$ layer 691 is grown to a thickness typically corresponding to one quarter of the emission wavelength. C-doped $Al_yGa_{1-y}As$ layer 692 is grown to a thickness corresponding to one quarter of the emission wavelength with about 100–300 Å of linear grading at each interface. Finally, the growth is completed by growing heavily C-doped GaAs contact layer 695 to a thickness in the range of about 500–1000 Å. C-doped GaAs contact layer 695 is typically doped in the range of $5.0 \times 10^{18} – 1.0 \times 10^{20}$ cm$^{-3}$.

Figure 7:
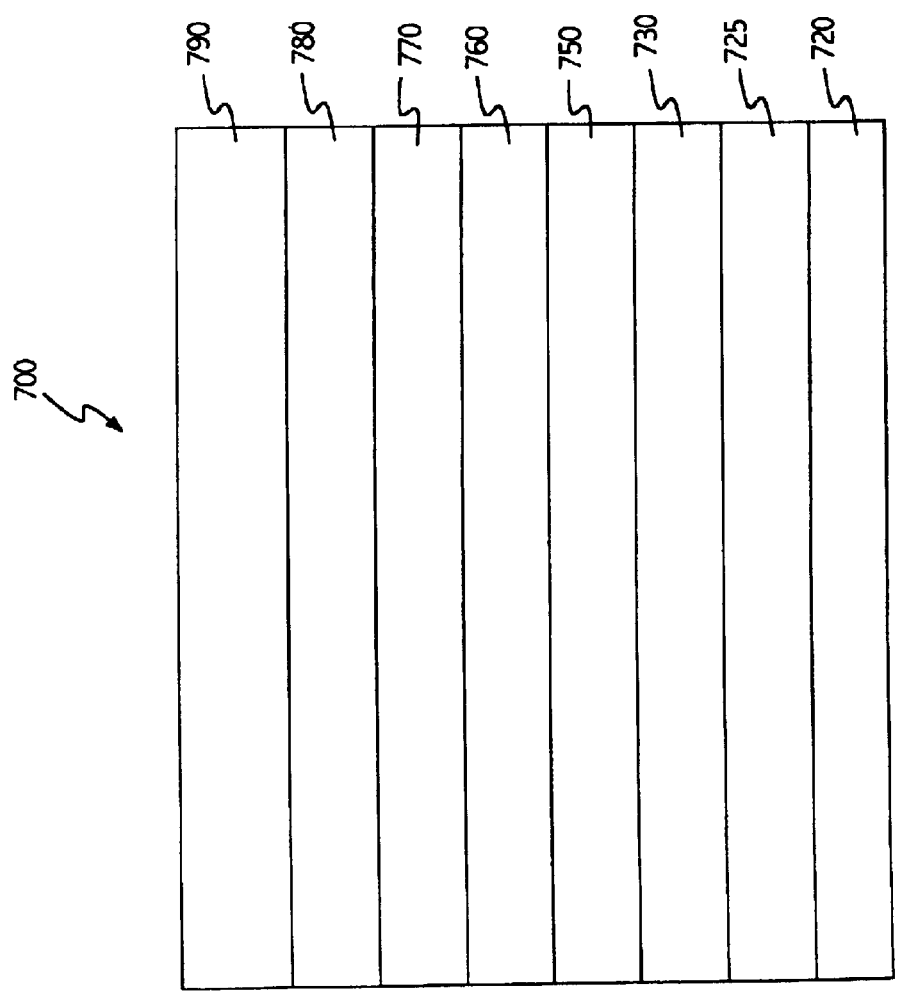
FIG. 7 shows a hetero bipolar transistor structure in accordance with the invention.

Typically, C-doped $Al_xGa_{1-x}As$ layer 685 is used to make the laterally oxidized layer for the purpose of optical confinement and current confinement. The value of x for C-doped $Al_xGa_{1-x}As$ layer 685 is selected higher than the value of x selected for any other C-doped $Al_xGa_{1-x}As$ layer in the structure since the rate of oxidation is strongly dependent on the Al content of C-doped $Al_xGa_{1-x}As$ layer 685. See, for example, U.S. Pat. No. 5,896,408, incorporated by reference in its entirety, for details. Ion implantation may also be used to realize current confinement either alone or in conjunction with laterally oxidized layer FIG. 7 shows hetero bipolar transistor structure 700 in an embodiment in accordance with the invention. In this case, no TMAl is introduced prior to the growth of the N containing layers so there is no Al contamination during a single run of the MOCVD reactor. However, in typical commercial applications, reactors are used repeatedly and the MOCVD reactor will typically accumulate residual TMAl from the prior run(s). Hence, a source of Al contamination for the N containing layers will be present after the first run and embodiments in accordance with the invention enhance process reproducibility and reduction of recombination centers in InGaAsN layers 750 and 760 (see FIG. 7).

Undoped GaAs buffer layer 725 is grown on GaAs substrate 720 to a thickness in the range of 1000–5000 Å. C-doped GaAs subcollector layer 730, doped in the range of $5.0 \times 10^{17} – 5.0 \times 10^{18}$ cm$^{-3}$ is grown on GaAs buffer layer 725 to a thickness in the range of 3000–7000 Å, with a typical thickness of about 5000 Å and at a temperature in the range of 600–800° C. Growth is stopped by turning off the supply of TMGa and CBr$_4$. Then, a flow of NH$_3$ is introduced at a typical flow rate of about 500 sccm along with a flow of AsH$_3$ at a typical flow rate of about 300 sccm into MOCVD reactor 120, for a period of approximately 4 minutes while the growth temperature is reduced to the range of about 550–650° C. The selected time and flow rate of the NH$_3$ assure that the total number of N atoms is greater than the total number of Al atoms introduced into reactor 120 after the last NH$_3$ flow was introduced in the reactor 120. After the growth temperature is in the proper range of about 550–650° C. and NH$_3$ gas flow is stopped, C-doped InGaAsN collector layer 750 is grown to a typical thickness in the range of about 1000–5000 Å on C-doped GaAs subcollector layer 730 with doping levels in the range of $5.0 \times 10^{17} – 5.0 \times 10^{18}$ cm$^{-3}$. Then Si-doped InGaAsN base layer 760 is grown to a thickness in the range of about 500–2000 Å. Si-doping in InGaAsN base layer 760 is typically doped in the range of $5.0 \times 10^{17} – 5.0 \times 10^{18}$ cm$^{-3}$. C-doped AlGaAs emitter layer 780 is typically grown to a thickness in the range of about 500–2000 Å over Si-doped InGaAsN base layer 760. Undoped AlGaAs spacer layer 770 having a typical thickness of about 50 Å may be inserted between Si-doped InGaAsN base layer 760 and C-doped AlGaAs emitter layer 780 as shown in FIG. 7. The C-doping level in AlGaAs emitter layer 780 is in the range of $5.0 \times 10^{17} – 5.0 \times 10^{18}$ cm$^{-3}$. Finally, growth is completed by growing C-doped GaAs contact layer 790 to a thickness in the range of about 500–3000 Å. The C-doping level in GaAs contact layer 790 is in the range of about $5.0 \times 10^{18} – 1.0 \times 10^{20}$ cm$^{-3}$.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

We claim:

1. A method for making a semiconductor structure in a single reactor chamber using metal-organic chemical vapor deposition comprising:
   providing a substrate comprising GaAs in said reactor chamber;
   growing a plurality of semiconductor layers over said substrate, at least one of said plurality of semiconductor layers comprising aluminum;
   introducing a gas flow comprised of an aluminum gettering chemical into said reactor chamber containing said substrate and said plurality of semiconductor layers; and
   growing a layer comprising In, Ga, As, and N over said plurality of semiconductor layers after said gas flow is stopped.

2. The method of claim 1 wherein said gas flow comprises a gas selected from the group consisting of phosphine and ammonia gases.

3. The method of claim 1 wherein said aluminum gettering chemical comprises nitrogen atoms.

4. The method of claim 1 wherein said aluminum gettering chemical comprises phosphorus atoms.

5. The method of claim 1 wherein said aluminum gettering chemical is dimethylhydrazine.

6. The method of claim 1 wherein an amount of aluminum gettering atoms introduced by said gas flow into said reactor chamber is greater than an amount of aluminum atoms introduced into said chamber to grow said at least one of said plurality of semiconductor layers comprising aluminum.

7. The method of claim 1 wherein introducing said gas flow is accompanied by a growth interruption of said plurality of semiconductor layers.

8. A method for making a semiconductor structure in a single reactor chamber using metal-organic chemical vapor deposition comprising:
   providing a substrate comprising GaAs in said reactor chamber;
   growing a first plurality of semiconductor layers over said substrate;
   introducing a gas flow comprised of an aluminum gettering chemical into said reactor chamber containing said substrate and said first plurality of semiconductor layers;
   growing a layer comprising In, Ga, As and N over said first plurality of semiconductor layers after said gas flow is stopped; and
   growing a second plurality of semiconductor layers over said layer, at least one of said second plurality of semiconductor layers comprising aluminum.

9. The method of claim 8 wherein said gas flow comprises a gas selected from the group consisting of ammonia and phosphine gases.

10. The method of claim 8 wherein said aluminum gettering chemical comprises phosphorus atoms.

11. The method of claim 8 wherein said aluminum gettering chemical comprises nitrogen atoms.

12. The method of claim 8 wherein said aluminum gettering chemical is dimethylhydrazine.

13. The method of claim 8 wherein introducing said gas flow is accompanied by a growth interruption of said first plurality of semiconductor layers.

14. The method of claim 8 wherein an amount of aluminum gettering atoms introduced by said gas flow into said reactor chamber is greater than an amount of aluminum atoms introduced into said chamber to grow said at least one of said second plurality of semiconductor layers comprising aluminum.

15. A method for metal-organic chemical vapor deposition growth in a single reactor chamber of a semiconductor structure having a layer comprising In, Ga, As and N that comprises the introduction of an aluminum gettering chemical into said single reactor chamber after growth of an aluminum containing semiconductor layer and prior to growth of said layer comprising In, Ga, As and N.

16. The method of claim 15 wherein said aluminum gettering chemical comprises nitrogen atoms.

17. The method of claim 15 wherein said aluminum gettering chemical comprises phosphorus atoms.

18. The method of claim 15 wherein said aluminum gettering chemical is dimethylhydrazine.

19. The method of claim 15 wherein a number of aluminum gettering atoms in said aluminum gettering chemical introduced into said reactor chamber is greater than a number of aluminum atoms introduced into said reactor chamber for growth of said aluminum containing semiconductor layer.

20. The method of claim 15 additionally comprising the introduction of an arsenic precursor into said reactor chamber at substantially the same time as the introduction of said aluminum gettering chemical into said reactor chamber.

* * * * *